United States Patent [19]
Weng et al.

[11] Patent Number: 5,574,448
[45] Date of Patent: Nov. 12, 1996

[54] METHOD AND APPARATUS FOR ENCODING DATA WITH VARIABLE BLOCK LENGTHS

[75] Inventors: Lih-Jyh Weng, Shrewsbury; John DeRoo, Marlborough; Michael Leis, Framingham, all of Mass.

[73] Assignee: Quantum Corporation, Milpitas, Calif.

[21] Appl. No.: 436,980

[22] Filed: May 8, 1995

[51] Int. Cl.$^6$ .................................................. H03M 7/46
[52] U.S. Cl. ............................................. 341/59; 382/245
[58] Field of Search .................... 341/59, 50; 400/261.1; 384/34; 382/245

[56] References Cited

U.S. PATENT DOCUMENTS 4,760,378   7/1988   Iketani et al. ............................. 341/59

*Primary Examiner*—Brian K. Young
*Attorney, Agent, or Firm*—David B. Harrison; Patricia A. Sheehan

[57] ABSTRACT

An encoding system uses a modified 8/9 rate modulation code to encode 8-bit data symbols into 9-bit cells in a conventional manner in accordance with the modified code and 9-bit ECC symbols into 10-bit cells by (i) encoding 8 bits of the symbol into a 9-bit cell in accordance with the modified code, and (ii) inserting into the 9-bit cell the remaining, that is, the non-encoded, bit of the ECC symbol. The system reproduces the 8-bit data symbols by decoding the 9-bit cells in a conventional manner in accordance with the modified code, and the 9-bit ECC symbols by (i) removing from the associated 10-bit cell the bit inserted during encoding, (ii) decoding the remaining 9 bits to reproduce 8 bits of the symbol, and (iii) inserting into the 8 bits the bit that was earlier removed. In an exemplary embodiment, the 8 least significant bits of the ECC symbol are encoded using the modified 8/9 rate code. The 9 bits produced by the code are used essentially as the first "c" bits and last "10-c" bits of a 10-bit cell. The most significant bit of the ECC symbol is included in the cell as the $c+1^{st}$ bit. The mapping of 8 bits to 9-bit cells is such that the inclusion of this $c+1^{st}$ bit does not violate the code's run length limitations, either within the cell or within a modulation code word, which is a concatenation of the cells. The system can similarly encode, using a modified n/m rate code, n-bit and (n+i)-bit symbols, where (n+i)<m, to produce, respectively, m-bit cells and (m+i)-bit cells.

17 Claims, 3 Drawing Sheets

METHOD AND APPARATUS FOR ENCODING DATA WITH VARIABLE BLOCK LENGTHS

FIELD OF THE INVENTION

This invention relates generally to data processing systems and, more particularly, to a system for encoding and decoding data using a demodulation code.

BACKGROUND OF THE INVENTION

More and more digital data are being stored on a given size of magnetic disk. The data, in the form of bits, are stored as a sequence of flux reversals—with, for example, a "1" being recorded as a flux reversal and a "0" being recorded as the absence of flux reversal. As the density of the data stored on the disk increases, so does the likelihood that adjacent or nearby flux reversals will adversely interfere with one another. Such interference, which is referred to as "inter-symbol interference," may cause the bits to be misinterpreted, and may thus result in loss of the underlying data.

To protect against misinterpretation, the data are typically stored on the disk in encoded form. Prior to recording, multiple-bit data symbols are encoded using an error correction code (ECC). When the data symbols are retrieved from the disk and demodulated, the ECC is employed to, as the name implies, correct the erroneous data.

Specifically, before a string of k data symbols is written to a disk, it is mathematically encoded using an (n,k) ECC to form n-k ECC symbols. The ECC symbols are then appended to the data string to form n-symbol error correction code words—data symbols plus ECC symbols—and the code words are written to, or stored on, the disk. When data are read from the disk, the code words containing the data symbols are retrieved and mathematically decoded. During decoding, errors in the data are detected and, if possible, corrected through manipulation of the ECC symbols [For a detailed description of decoding see Peterson and Weldon, *Error Correction Codes*, 2d Edition, MIT Press, 1972].

To correct multiple errors in strings of data symbols, ECCs that efficiently and effectively utilize the various mathematical properties of sets of symbols known as Galois Fields are typically used. Galois Fields are represented "$GF(P^q)$", where "P" is a prime number and "q" can be thought of as the number of digits, base P, in each element or symbol in the field. "P" usually has the value 2 in digital computer applications and, therefore, "q" is the number of bits in each symbol.

The number of symbols that the ECC can effectively encode and correct, or "protect", is limited by the size of the Galois Field selected, i.e. $2^q$ symbols, and the maximum number of errors that the code is capable of correcting. The maximum length of, for example, a code word of a Reed-Solomon ECC over $GF(2^q)$ is $2^q-1$ symbols. Thus the maximum number of data symbols that can be protected by the ECC, i.e., included in the code word, is $2^q-1$ symbols minus "n", where "n" is the number of ECC symbols required to correct the maximum number of errors. The larger the Galois Field, the longer the code word, and the more data the ECC can protect for a given maximum number of errors to be corrected. Therefore, larger Galois Fields could be used to protect longer strings of data symbols.

Computers typically are designed to manipulate 8-bit data symbols, or bytes. The ECCs over $GF(2^8)$ are, however, too short to protect all of the 8-bit symbols that are currently recorded in a sector of a disk. Specifically, a total of 512 symbols are recorded in a sector, and an ECC over $GF(2^8)$ produces code words that are $2^8-1$, or 255, symbols long. Accordingly, to protect a sector, the ECC over $GF(2^8)$ must be manipulated by, for example, interleaving. As the data density further increases, the number of times the code must be interleaved increases, which adds to the complexity of the error correction encoder. Such manipulation of the code also increases the complexity of the decoder, and the time it takes the decoder to decode the code words and correct any errors.

To avoid multiple interleaving, a longer code may be used. Thus the system may use a code over $GF(2^9)$, which produces code words of up to $2^9-1$, or 511, symbols, and with slight manipulation code words of 512 symbols. One problem with using a longer code is that the code produces longer ECC symbols, and requires longer data symbols for encoding.

System components other than the error correction encoder and decoder are typically set up to handle bytes or multiples of bytes, not the longer 9-bit symbols. Thus, there is a system constraint on the size of the data symbols. These system components, however, do not generally handle the ECC symbols, and there is no such constraint on the length of these symbols.

A prior known system using the longer code encodes 8-bit data symbols as 9-bit symbols by assigning each 8-bit data symbol a first bit that has a predetermined value of, for example, 1. This first, known bit need not be recorded as part of the data symbol, since the bit can be supplied when it is needed by the ECC encoder or decoder. The encoder and the decoder thus annex the predetermined bit to the 8-bit data symbols before these symbols are manipulated to produce ECC symbols. The other system components require only the 8 data bits.

The ECC encoder encodes the 9-bit data symbols and produces 9-bit ECC symbols with first bits that may be either 0's or 1's. Accordingly, these first bits must be retained, and the ECC symbols are recorded as 9-bit symbols.

After the data have been encoded into an error-correction code word and before the code word is recorded, the code word symbols are again encoded using a rate b/b+i run length limited modulation code. This code manipulates groups of "b" bits and forms for each group a (b+i)-bit "cell," which meets the run length limitations of the code for numbers of consecutive 1's and 0's. The number of consecutive 0's is limited to ensure that the decoder can recover a clock from the stored information, and the number of consecutive 1's is limited essentially to minimize intersymbol interference. The system concatenates the cells to form a modulation code word that meets the code's run length limitations. This code word is then recorded on the disk, as a series of flux reversals.

A prior known system utilizes an 8/9 rate modulation code to encode 8 bits of the error correction code word into a 9-bit cell for recording. This code encodes an 8-bit data symbol to a 9-bit cell, and a 9-bit ECC symbol to two cells. The first ECC symbol, for example, has 8 of its bits encoded to produce one cell and 1 of its bits encoded along with 7 of the bits of the second ECC symbol to produce a second cell, and so forth.

If the system incorrectly demodulates one of the cells that is associated with a data symbol, the result is a one symbol error in the error-correction code word. If, however, the system incorrectly demodulates a cell that is associated with two ECC symbols, the result is two erroneous error-correction code word symbols. This is what is known as "demodulation error propagation." If too many of the code word symbols are erroneous, the error correction code word becomes uncorrectable.

To solve the demodulation error propagation problem, the system could use a longer modulation code. For example, the system could use a 9/10 rate modulation code, which encodes 9-bit symbols to 10-bit cells. However, this longer code splits all but the first data symbol between two cells, and thus, has an error propagation problem that is worse than the previous system, since it encodes a greater number of data symbols than ECC symbols. Conversely, the 9/10 rate modulation code could be used to encode separately each of the code word symbols, producing for each symbol an associated 10-bit cell. It would thus encode an 8-bit data symbol to an associated 10-bit cell, and not split the symbol between two cells. This avoids demodulation error propagation, however, it is an inefficient use of disk space.

Alternatively, two modulation codes could be used—an 8/9 rate code for the data symbols and a 9/10 rate code for the ECC symbols. This solves both the inefficiency and the error propagation problems; however, it requires that the modulation and demodulation circuitry perform two different encoding and decoding operations. The time and complexity involved in performing these two operations makes this an unworkable solution.

SUMMARY OF THE INVENTION

The invention is a system that uses a modified 8/9 rate modulation code to encode both 8-bit data symbols and 9-bit ECC symbols. The system encodes each of the 8-bit data symbols in accordance with the modified 8/9 rate code in a conventional manner and produces corresponding 9-bit cells. It encodes each of the 9-bit ECC symbols by (i) encoding 8 of the bits of the symbol into a 9-bit cell in accordance with the modified 8/9 rate code, and (ii) inserting into the 9-bit cell the remaining, that is, the non-encoded, bit of the ECC symbol, to produce an associated 10-bit cell.

The system reproduces the 8-bit data symbols by demodulating the associated 9-bit cells in a conventional manner in accordance with the modified code. It reproduces the 9-bit ECC symbols from the 10-bit cells by (i) removing the bit inserted during encoding, (ii) decoding the remaining 9 bits in a conventional manner using the modified code to reproduce 8 bits of the ECC symbol, and (iii) inserting therein the bit that was earlier removed from the associated 10-bit cell.

In an exemplary embodiment, all but the most significant bit of an ECC symbol is encoded using the modified 8/9 rate code. The 9 bits produced by the code are used essentially as the first "c" bits and last "10-c" bits of a 10-bit cell. The most significant bit of the ECC symbol is then included in the cell as the $c+1^{st}$ bit. The mapping of 8 bits to 9-bit cells is chosen such that the inclusion of this $c+1^{st}$ bit does not violate the code's run length limitations, either within the cell or within the concatenation of the cells that forms the modulation code word.

The system described above uses essentially the same operations to encode and decode the data and the ECC symbols, with insertion steps added to the operations associated with the ECC symbols. The system thus uses the same encoder and decoder hardware for the data symbols and the ECC symbols. Accordingly, the system eliminates the problems of demodulation error propagation, without substantially increasing the complexity of the encoder and decoder. It also solves the problem of inefficient use of disk space by including only a single extra bit in each cell.

The system can similarly generate a modified n/m rate code that encodes n-bit symbols to m-bit cells and (n+i)-bit symbols into (m+i)-bit cells, where n+i<m.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
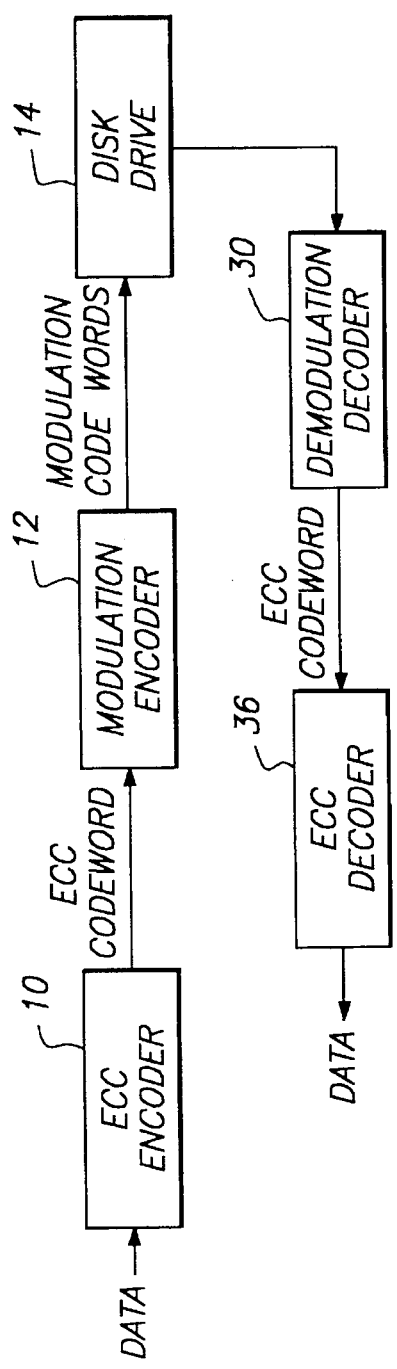
FIG. 1 is a functional block diagram of a system constructed in accordance with the invention.

Referring to FIG. 1, a conventional error-correction encoder 10 encodes "k" 8-bit data symbols, or bytes, in accordance with an (n,k) ECC over $GF(2^9)$, annexing a predetermined bit to each of the 8-bit data symbols before encoding. The encoder produces "n–k" 9-bit ECC symbols, and concatenates them with the 8-bit data symbols to form an error-correction code word.

The error-correction encoder 10 supplies the code word to a modulation encoder 12. The modulation encoder, which is discussed in more detail with reference to FIG. 2 below, encodes the 8-bit data symbols and 9-bit ECC symbols using a modified 8/9 rate run length limited modulation code, to produce, respectively, k 9-bit cells and n–k 10-bit cells. These cells are concatenated to form an n-cell modulation code word with at most four consecutive 0's and five consecutive 1's. The disk drive 14 records the modulation code word on a disk (not shown) as a series of flux reversals.

When the modulation code words are retrieved from the disk, a demodulation decoder 30, which is discussed in more detail with reference to FIG. 4 below, reproduces the 8-bit data symbols and the 9-bit ECC symbols. It then supplies these symbols to an error correction decoder 36 that decodes and, as necessary, corrects errors in the data symbols in a conventional manner.

Figure 2:
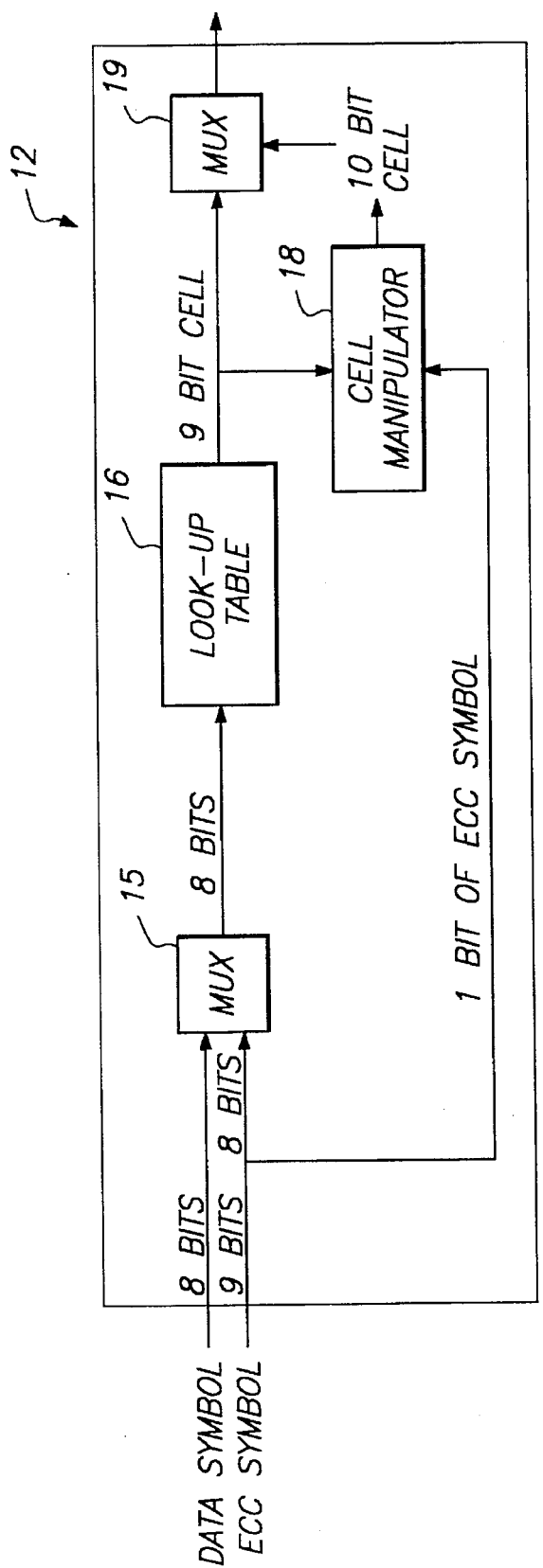
FIG. 2 is a functional block diagram of a modulation encoder of FIG. 1.

Referring now to FIG. 2, the modulation encoder 12 includes a look-up table 16, which is addressed using, as appropriate, an 8-bit data symbol or 8 bits of a 9-bit ECC symbol, for example, the 8 least significant bits. A multiplexer 15 passes 8 bits to the look-up table 16 and, as appropriate, passes a $9^{th}$ bit to a cell manipulator 18, as discussed below.

In response to the 8-bit address, the look-up table 16 produces an associated 9-bit cell that meets the run length limitations of the code. If the 8-bit address is associated with a data symbol, the encoder includes the 9-bit cell in the modulation code word. If the 8-bit address is associated with an ECC symbol, a cell manipulator 18 manipulates the 9-bit cell, as discussed below, to produce an associated 10-bit cell. The encoder, through multiplexer 19, concatenates the 10-bit cells with the 9-bit cells to produce the modulation code word.

Figure 3:
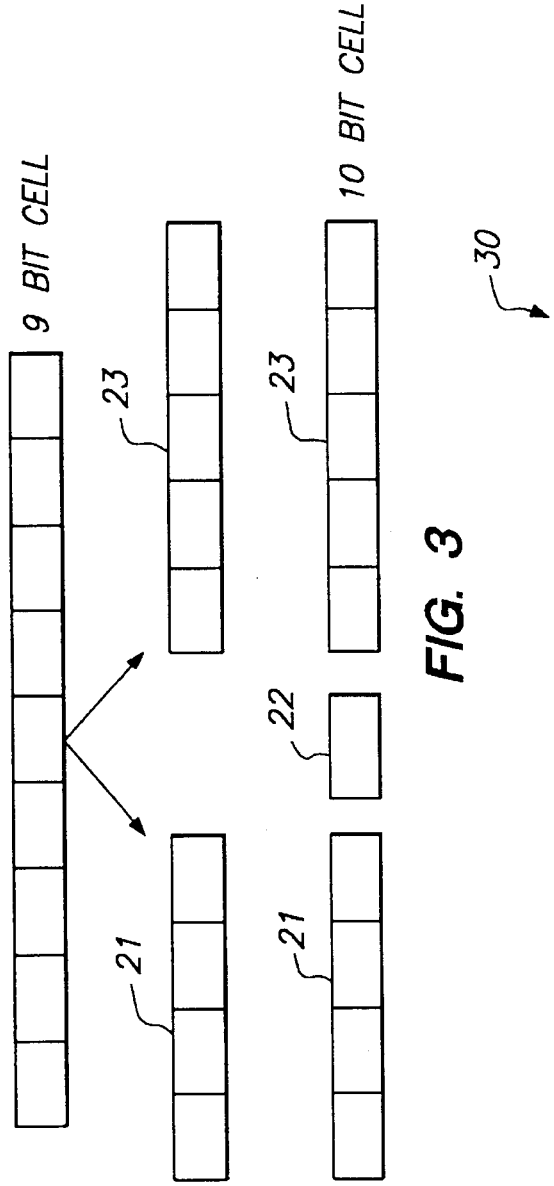
FIG. 3 depicts a cell.

The cell manipulator 18 segments the 9 bits retrieved from the look-up table 14 into two sections 21 and 23, as illustrated in FIG. 3. The first section 21 includes the "c" most significant bits of the cell and the last section 23 includes the 9-c least significant bits of the cell. The cell manipulator 18 then inserts between these two sections the bit of the ECC symbol that was not used to form the address for look-up table 16. In the example, the manipulator 18 inserts into the cell the most significant bit of the associated ECC symbol. The result is a 10-bit cell 24 that includes first, second and last sections 21, 22 and 23. In the exemplary embodiment, c=4, and the 10-bit cell has a four-bit first section 21, a one-bit middle section 22, and a five-bit last section 23.

The 10-bit cell must meet the run length limitations of the modulation code. Thus the 9-bit cells can have in the bits that are adjacent to the inserted bit a run of at most three consecutive 0's or four consecutive 1's, since the inserted bit can be either a 1 or 0. These stricter run length limitations are not required in the conventional 8/9 rate code, which requires only that the 9-bit cells, in their entirety and in the arbitrary concatenations that form the modulation code words, do not exceed the full 0 and 1 run length limitations.

Figure 4:
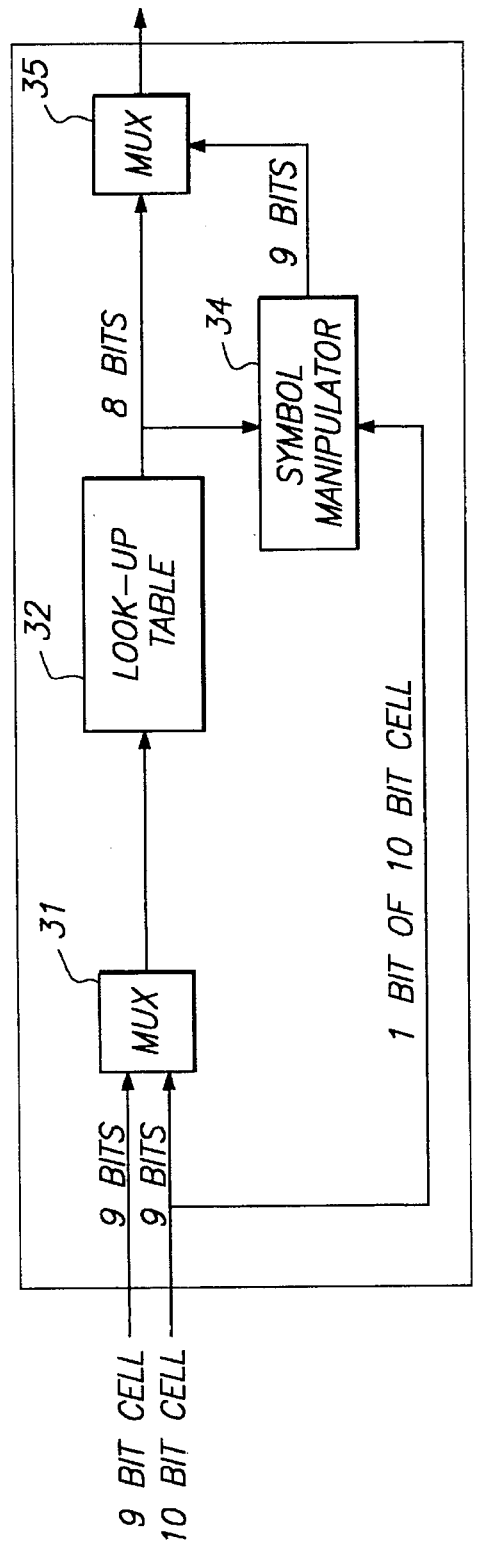
FIG. 4 is a functional block diagram of a modulation decoder of FIG. 1.

FIG. 4 depicts in more detail the demodulation decoder 30, which decodes the 9-bit and 10-bit cells. The decoder includes a look-up table 32 that is addressed through multiplexer 31 using either a 9-bit cell associated with a data symbol or the 9 bits that form the first and last sections 21 and 23 (FIG. 3) of a 10-bit cell. The look-up table 32 provides 8 bits in response to the 9-bit address.

If the decoder 30 is demodulating a 9-bit cell, the decoder provides the 8 bits retrieved from the table 32 through a multiplexer 35 to the error correction decoder 36 as a data symbol. If the decoder 30 is demodulating a 10-bit cell, a symbol manipulator 34 includes, as a $9^{th}$ bit of the associated ECC symbol, the bit that forms section 22 of the 10-bit cell (FIG. 3). The manipulator 34 thus includes as the most significant bit of the ECC symbol the bit that was inserted into the 10-bit cell by the manipulator 18 (FIG. 1). The 9-bit ECC symbols are then provided to the error correction decoder through multiplexer 35.

Appendix A contains a table of an exemplary code. An 8-bit data symbol or the 8 least significant bits of a 9-bit ECC symbol listed in the first column of the table are encoded to the corresponding 9-bit cell listed in the second column. The 9-bit cell produced by encoding of the 8 bits of the ECC symbol is further manipulated into one of the corresponding 10-bit cells listed in the third or fourth columns by inserting into the 9-bit cell the bit of the ECC symbol that was not previously encoded. The corresponding 10-bit cell in the third column is produced by inserting a "0" between the fourth and fifth bits of the 9-bit cell. The corresponding 10-bit cell in the fourth column is produced by inserting a "1" between these bits.

Figure 5:
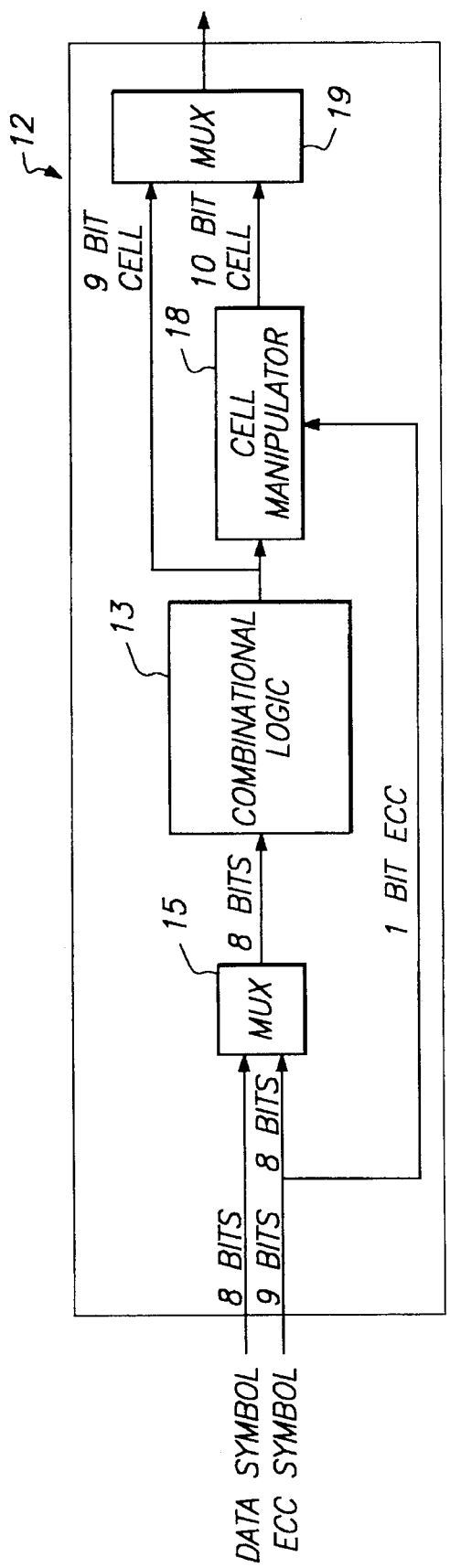
FIG. 5 depicts an alternative construction of the modulation encoder.

The first step in decoding a 10-bit cell is to remove from the cell the bit that was inserted during encoding, that is, to determine the corresponding entry in the second column of the table of FIG. 5 for the 10-bit cell. The corresponding entry in the first column of the table is then used as the 8 least significant bits of the associated ECC symbol, and the appropriate bit of the 10-bit symbol, that is, the bit inserted during encoding and subsequently removed during decoding, is included as the most significant bit of the 9-bit ECC symbol. The 9-bit cells are decoded by associating them with the corresponding entry in the first column of the table.

Figure 6:
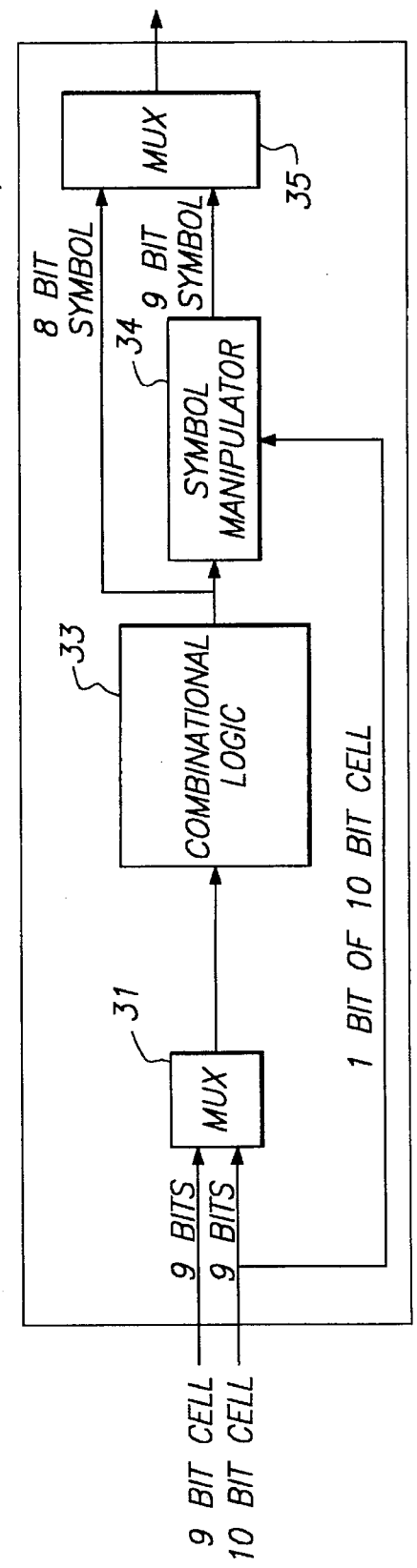
FIG. 6 depicts an alternative construction of the modulation decoder.

FIGS. 5 and 6 depict, respectively, the modulation encoder 12 and the demodulator decoder 30 with combinational logic circuits 13 and 31 replacing the look-up tables 16 and 32. The logic circuit 13 combines the 8-bits of the data symbols or the 8 least significant bits of the ECC symbols and produces the associated 9-bit cells. The logic circuit 31 combines the 9-bit cells associated with the data symbols, or the corresponding 9 bits of the 10-bit cells and reproduces 8 bits of the associated data or ECC symbols. The manipulators 18 and 34, operating as described above, manipulate the cells and bits produced, respectively, by the logic circuits 13 and 31, to produce the appropriate modulation or error-correction code words.

There are 288 potential 8/9 rate code word symbols, that is, 288 potential 9-bit cells that meet the run length limitations of the modified 8/9 rate code. There are, however, only 256 possible 8-bit symbols that can be encoded into the 9-bit cells. Accordingly, there are 32 extra 9-bit cells, which map to 64 extra 10-bit cells. These extra 9-bit and 10-bit cells can be used for out-of-band signalling, as appropriate.

In general, the system can encode using a modified n/m rate code n-bit symbols to m-bit cells and (n+i)-bit symbols to (m+i)-bit cells, where i=1, 2 . . . , and n+i<m. The system encodes to an m-bit cell either an n-bit symbol or n bits of an m-bit symbol. Then, as appropriate, the system inserts the i non-encoded bits of the symbol into the associated m-bit cell, to produce an (m+i)-bit cell.

The m-bit cells must, in the bits adjacent to the inserted bits, meet run length limitations that are stricter than the n/m rate code. Specifically, the bits adjacent to the inserted bits must meet limitations of z-i-zeros, where z is the run length of zeros in the n/m rate code, and r-i ones, where r is the run length of ones in the n/m rate code. If the m-bit cells meet these limitations, the inserted bits can be any sequence of digital values, without violating the run length limitations of the code.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

APPENDIX A

| 8-bit Data Symbol or 8 bits of ECC Symbol | 9-bit Cell | 10-bit Cell (inserted "0" bit) | 10-bit Cell (inserted "1" bit) |
| --- | --- | --- | --- |
| 000 | 044 | 084 | 094 |
| 001 | 045 | 085 | 095 |
| 002 | 046 | 086 | 096 |
| 003 | 047 | 087 | 097 |
| 004 | 049 | 089 | 099 |
| 005 | 04a | 08a | 09a |
| 006 | 04b | 08b | 09b |
| 007 | 04c | 08c | 09c |
| 008 | 04d | 08d | 09d |
| 009 | 04e | 08e | 09e |
| 00a | 051 | 0a1 | 0b1 |
| 00b | 052 | 0a2 | 0b2 |
| 00c | 053 | 0a3 | 0b3 |
| 00d | 054 | 0a4 | 0b4 |
| 00e | 055 | 0a5 | 0b5 |
| 00f | 056 | 0a6 | 0b6 |
| 010 | 057 | 0a7 | 0b7 |
| 011 | 059 | 0a9 | 0b9 |
| 012 | 05a | 0aa | 0ba |
| 013 | 05b | 0ab | 0bb |
| 014 | 05c | 0ac | 0bc |
| 015 | 05d | 0ad | 0bd |
| 016 | 05e | 0ae | 0be |
| 017 | 062 | 0c2 | 0d2 |
| 018 | 063 | 0c3 | 0d3 |
| 019 | 064 | 0c4 | 0d4 |
| 01a | 065 | 0c5 | 0d5 |
| 01b | 066 | 0c6 | 0d6 |
| 01c | 067 | 0c7 | 0d7 |
| 01d | 069 | 0c9 | 0d9 |
| 01e | 06a | 0ca | 0da |
| 01f | 06b | 0cb | 0db |
| 020 | 06c | 0cc | 0dc |
| 021 | 06d | 0cd | 0dd |
| 022 | 06e | 0ce | 0de |
| 023 | 071 | 0e1 | 0f1 |
| 024 | 072 | 0e2 | 0f2 |
| 025 | 073 | 0e3 | 0f3 |

What is claimed is:

1. An encoding system for encoding b-bit symbols and e-bit symbols using a modified n/m rate run length limited modulation code that limits the run length of consecutive zero's to z and consecutive one's to r, the system including:

A. a modulation code encoder for encoding a b-bit symbol or b bits of an e-bit symbol to form an n-bit cell;

B. a cell manipulator for producing, from an n-bit cell associated with an e-bit symbol, an (m+i)-bit cell that satisfies the run length limitations of the modulation code, the manipulator inserting into the n-bit cell the i=e-b bits of the associated e-bit symbol that the encoder refrained from encoding; and C. means for producing a modulation code word by concatenating the n-bit cells associated with the b-bit symbols, and the (m+i)-bit cells associated with the e-bit symbols.

2. The encoding system of claim 1, wherein the modulation code encoder produces cells in which the bits adjacent to the i inserted bits meet stricter run length limitations of z-i for zeros and r-i for ones.

3. The encoding system of claim 1, wherein the encoder encodes the b-bit symbols and e-bit symbols using a look-up table that produces an n-bit cell in response to a b-bit address, the encoder using as the addresses the b-bit symbols and b bits of the e-bit symbols.

4. The encoding system of claim 1, wherein the encoder encodes the b-bit symbols and the b bits of the e-bit symbols using combinational logic.

5. The encoding system of claim 1, wherein the encoder encodes the b least significant bits of the e-bit symbol to produce the associated n-bit cell.

6. The encoding system of claim 4, wherein the cell manipulator inserts into the n-bit cell associated with the e-bit symbol the most significant i bits of that symbol.

7. The encoding system of claim 6, wherein the cell manipulator segments the n-bit cell into two sections and inserts the i bits of the e-bit symbol between the two sections, to form an m-bit cell.

8. The encoding system of claim 1 further including a decoding sub-system, the decoding sub-system including:

A. a modulation decoder for decoding the n-bit cell to reproduce a b-bit symbol, and n bits of the m-bit cell to reproduce b bits of the associated e-bit symbol;

B. a symbol manipulator for producing from the b bits associated with the m-bit cell, an e-bit error correction code symbol, the manipulator inserting into the b bits the i bits that the decoder refrained from decoding; and C. means for producing a code word by concatenating the b-bit symbols cells produced by the decoder and the e-bit symbols produced by the symbol manipulator.

9. The encoding system of claim 8 wherein:

a. the encoder encodes the b least significant bits of the e-bit symbol to produce the associated n-bit cell;

b. the cell manipulator inserts into the n-bit cell associated with the e-bit symbol the most significant i bits of that symbol;

c. the decoder decodes n bits of the associated m-bit cell and refrains from decoding the i bits inserted into the cell by the encoder; and d. the symbol manipulator includes in the e-bit symbol, as the most significant bits, the i bits that the decoder refrained from decoding.

10. An encoding system for encoding 8-bit data symbols and 9-bit error correction code symbols using a modified 8/9 rate run length limited modulation code that limits the run length of consecutive zero's to four and consecutive one's to five, to form a modulation code word, the system including:

A. a modulation code encoder for encoding an 8-bit data symbol or 8 bits of a 9-bit error correction code symbol to form a 9-bit cell;

B. a cell manipulator for producing from a 9-bit cell associated with an error correction code symbol a 10-bit cell that satisfies the run length limitations of the modulation code, the manipulator inserting into the 9-bit cell the 1 bit of the associated error correction code symbol that the encoder refrained frown encoding; and C. means for producing a modulation code word by concatenating the 9-bit cells associated with the data symbols, and the 10-bit cells associated with the error correction symbols.

11. The encoder of claim 10, wherein the modulation code encoder produces 9-bit cells in which the bits that are adjacent to the inserted bits meet stricter run length limitations of three consecutive zeros and four consecutive ones.

12. The encoding system of claim 10, wherein the encoder encodes the data symbols and error correction code symbols using a look-up table that produces a 9-bit cell in response to an 8-bit address, the encoder using as the addresses the 8-bit data symbols and 8 bits of the 9-bit error correction code symbols.

13. The encoding system of claim 10, wherein the encoder encodes the 8-bit data symbols and the 8 bits of the error correction code symbols using combinational logic.

14. The encoding system of claim 10, wherein the encoder encodes the 8 least significant bits of the error correction code symbol to produce the associated 9-bit cell.

15. The encoding system of claim 14, wherein the cell manipulator inserts into the 9-bit cell associated with the error correction code symbol the most significant bit of that symbol.

16. The encoding system of claim 15, wherein the cell manipulator segments the 9-bit cell into two sections and inserts the bit of the error correction code symbol between the two sections to form a 10-bit cell.

17. The encoding system of claim 10 further including a decoding sub-system, the decoding sub-system including:

A. a modulation decoder for decoding the 9-bit cells to reproduce 8-bit data symbols and 9 bits of the 10-bit cells to reproduce 8 bits of the associated error correction code symbols;

B. a symbol manipulator for producing from the 8 bits associated with the error correction code symbols a 9-bit error correction code symbol, the manipulator inserting into the 8 bits the bit that the decoder refrained from decoding; and C. means for producing an error-correction code word by concatenating the 8-bit data symbols cells produced by the decoder and the 9-bit error correction code symbols produced by the symbol manipulator.

* * * * *